(12) United States Patent
Hao et al.

(10) Patent No.: US 10,209,596 B2
(45) Date of Patent: Feb. 19, 2019

(54) PIXEL STRUCTURE, METHOD OF MANUFACTURING THE SAME, ARRAY SUBSTRATE AND DISPLAY DEVICE

(71) Applicant: BOE TECHNOLOGY GROUP CO., LTD., Beijing (CN)

(72) Inventors: Xueguang Hao, Beijing (CN); Jianbo Xian, Beijing (CN); Pan Li, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/531,814

(22) PCT Filed: Sep. 5, 2016

(86) PCT No.: PCT/CN2016/098049
§ 371 (c)(1),
(2) Date: May 31, 2017

(87) PCT Pub. No.: WO2017/101524
PCT Pub. Date: Jun. 22, 2017

(65) Prior Publication Data
US 2017/0329164 A1    Nov. 16, 2017

(30) Foreign Application Priority Data

Dec. 18, 2015    (CN) .................... 2015 2 1064387 U

(51) Int. Cl.
*H01L 27/12*    (2006.01)
*G02F 1/1368*    (2006.01)
(Continued)

(52) U.S. Cl.
CPC .......... *G02F 1/1368* (2013.01); *G02F 1/1362* (2013.01); *G02F 1/136286* (2013.01);
(Continued)

(58) Field of Classification Search
CPC ............. H01L 27/1214; H01L 27/1251; H01L 27/3244–27/3297; H01L 29/4908;
(Continued)

(56) References Cited

U.S. PATENT DOCUMENTS

2002/0140877 A1    10/2002  Chen
2007/0229723 A1    10/2007  Huang
(Continued)

FOREIGN PATENT DOCUMENTS

| CN | 202839610 U | 3/2013 |
|----|-------------|--------|
| CN | 104267546 A | 1/2015 |
| CN | 204719374 U | 10/2015 |
| CN | 105159486 A | 12/2015 |
| CN | 205229635 U | 5/2016 |

OTHER PUBLICATIONS

International Search Report for Chinese International Application No. PCT/CN2016/098049 dated Nov. 4, 2016.

*Primary Examiner* — Cuong B Nguyen
(74) *Attorney, Agent, or Firm* — Calfee, Halter & Griswold LLP

(57) ABSTRACT

A pixel structure, an array substrate and a display device is provided. The pixel structure includes a base substrate, and a gate layer and a source/drain layer arranged on the base substrate. An overlapping region is present between the gate layer and the source/drain layer, and the gate layer and/or the source/drain layer comprises a hollow structure located in the overlapping region.

16 Claims, 3 Drawing Sheets

(51) Int. Cl.
*G02F 1/1362* (2006.01)
*H01L 29/423* (2006.01)
*H01L 29/786* (2006.01)
*H01L 29/08* (2006.01)
*H01L 29/417* (2006.01)
*G02F 1/136* (2006.01)

(52) U.S. Cl.
CPC ............ *H01L 27/124* (2013.01); *H01L 29/08* (2013.01); *H01L 29/41733* (2013.01); *H01L 29/423* (2013.01); *H01L 29/786* (2013.01); *H01L 29/78618* (2013.01); *G02F 2001/13606* (2013.01); *G02F 2201/123* (2013.01); *G02F 2201/50* (2013.01)

(58) Field of Classification Search
CPC .. H01L 51/0508–51/0533; H01L 2924/13069; H01L 29/41733; H01L 29/42384; H01L 29/66265
See application file for complete search history.

(56) References Cited

U.S. PATENT DOCUMENTS

2010/0207122 A1\* 8/2010 Oh ..................... G02F 1/13458
                                                            257/59
2014/0061691 A1   3/2014 Choi et al.
2017/0133402 A1   5/2017 Ning et al.

\* cited by examiner

PIXEL STRUCTURE, METHOD OF MANUFACTURING THE SAME, ARRAY SUBSTRATE AND DISPLAY DEVICE

RELATED APPLICATIONS

The present application is the U.S. national phase entry of PCT/CN2016/098049, with an international filing date of Sep. 5, 2016, which claims the benefit of Chinese Patent Applications No. 201521064387.3, filed on Dec. 18, 2015, the entire disclosures of which are incorporated herein by reference.

FIELD

The present disclosure relates to the field of display technologies, and particularly to a pixel structure, a method of manufacturing the same, an array substrate and a display device.

BACKGROUND

Thin film transistor liquid crystal displays (TFT-LCDs) have characteristics including small size, low power consumption, no radiation and the like, and dominate the current flat panel display market. The TFT-LCD mainly consists of an array substrate and a color film substrate arranged in cell alignment, wherein a gate layer (including a gate and a is gate line), a source/drain layer (including a source, a drain and a data line) and a pixel electrode are formed on the array substrate.

However, in the existing array substrate, there is a large coupling capacitance between the gate layer and the source/drain layer due to the presence of an overlapping region therebetween, resulting in insufficient TFT driving capability of the pixel and slow charging speed of the pixel.

This coupling capacitance is liable to cause a large variation (Δ Vp) in the pixel voltage, so that the set pixel voltage written through the data line changes after the TFT is turned off. Such a change in turn causes the gray scale displayed by the pixel in the end to deviate from the gray scale desired to be expressed by the originally written voltage, and causes the voltage having symmetrical positive and negative polarities which is originally written by the data line to deviate downward to generate DC residue.

SUMMARY

To at least partially alleviate or even eliminate the problems in the prior art, an aspect of the present disclosure provides a pixel structure comprising a base substrate as well as a gate layer and a source/drain layer arranged on the base substrate. An overlapping region is present between the gate layer and the source/drain layer, and the gate layer and/or the source/drain layer comprises a hollow structure located in the overlapping region.

In the pixel structure provided by the present disclosure, the overlapping area between the source/drain layer and the gate layer can be effectively reduced by arranging a hollow structure at a position on the gate layer where it overlaps the source/drain layer and/or at a position on the source/drain layer where it overlaps the gate layer, thereby reducing the coupling capacitance between the gate layer and the source/drain layer. The inclusion of the hollow structure enhances not only the TFT driving capability of the pixel, but also the charging and discharging capability of the pixel.

According to some embodiments, the hollow structure comprises one or more openings.

According to some embodiments, the shape of the opening of the hollow structure is any one of a triangular shape, a rectangular shape, and a circular shape.

According to some embodiments, the gate layer comprises a gate of a thin film transistor, and the source/drain layer comprises a source and a drain of the thin film transistor.

According to some embodiments, the overlapping region comprises an overlapping region between the source and the gate.

According to some embodiments, the overlapping region comprises an overlapping region between the drain and the gate.

According to some embodiments, the source/drain layer further comprises a data line connected to the source, wherein the width of the source is less than the width of the data line. By reducing the width of the source, the overlapping area between the source/drain layer and the gate layer can be further reduced.

According to some embodiments, the channel length of the thin film transistor is 2 μm to 8 μm, and in particular, the channel length of the thin film transistor may be 5 μm. Such a channel length has the advantages that the area of the gate can be reduced, and furthermore, not only the overlapping area between the source/drain layer and the gate layer can be reduced, but also an increase in the leakage current of the thin film transistor due to the decrease in the source width can be avoided.

According to some embodiments, the source/drain layer further comprises an intermediate electrode provided between the source and the drain and separate from the source and drain. The intermediate electrode can constitute a thin film transistor with the source and the drain, respectively, so as to avoid an increase in the leakage current of the thin film transistor due to the decrease in the source width.

According to some embodiments, the base substrate further comprises a gate insulating layer, an active layer, a protective layer, and a pixel electrode.

According to some embodiments, the active layer is made of amorphous silicon, polysilicon, or oxide semiconductor material.

Another aspect of the present disclosure further provides an array substrate comprising the above-described pixel structure.

A further aspect of the present disclosure further provides a display device including the above-described array substrate.

Another aspect of the present disclosure provides a method of manufacturing a pixel structure, comprising forming a gate layer on a base substrate; forming a gate insulating layer, an active layer, and a source/drain layer on the gate layer; forming a protective layer on the source/drain layer; forming a pixel electrode on the protective layer. An overlapping region is present between the gate layer and the source/drain layer, and the method further comprises forming, on the gate layer and/or the source/drain layer, a hollow structure located in the overlapping region.

It is to be noted that respective aspects of the present disclosure have the same or similar advantages and exemplary embodiments, and will not be described herein.

DETAILED DESCRIPTION

Example implementations of the present disclosure will be described below in further detail with reference to the accompanying drawings and embodiments. The following embodiments are provided to illustrate the present disclosure, rather than to limit the scope of the present disclosure.

Embodiments of the present disclosure provide a pixel structure comprising a base substrate, and a gate layer and a source/drain layer arranged on the base substrate. An overlapping region is present between the gate layer and the source/drain layer, and the gate layer and/or the source/drain layer comprises a hollow structure located in the overlapping region.

In the pixel structure provided by embodiments of the present disclosure, the overlapping area between the source/drain layer and the gate layer can be effectively reduced by arranging a hollow structure at a position on the gate layer where it overlaps the source/drain layer and/or at a position on the source/drain layer where it overlaps the gate layer, thereby reducing the coupling capacitance between the gate layer and the source/drain layer. The inclusion of the hollow structure enhances not only the TFT driving capability of the pixel, but also the charging and discharging capability of the pixel.

The hollow structure may be located on the gate layer, or located on the source/drain layer, or provided on both the gate layer and the source/drain layer.

In order to reduce the coupling capacitance of the gate and the source/drain, the hollow structure on the gate layer and/or the hollow structure on the source/drain layer may comprise one or more openings. The opening may have a triangular shape, a rectangular shape (e.g. oblong, square), a circular shape, or other irregular shapes.

Figure 1:
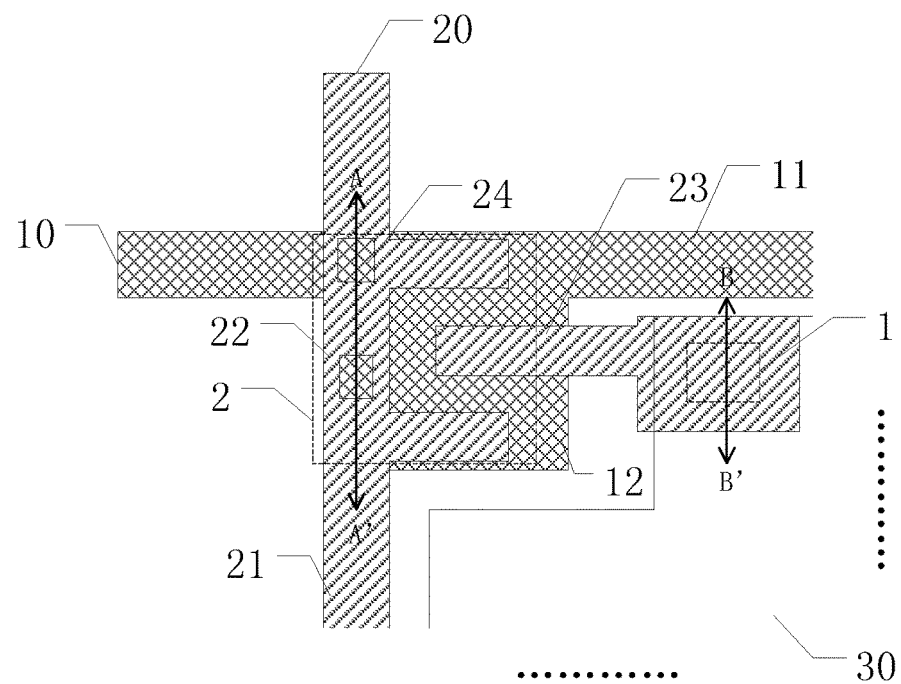
FIG. 1 is a top view of a pixel structure according to embodiments of the present disclosure.

Referring to FIG. 1, FIG. 1 is a top view of a pixel structure according to embodiments of the present disclosure. The pixel structure generally comprises a base substrate on which a gate layer, a gate insulating layer (GI layer), an active layer, a source/drain layer, a protective layer (PL layer), a pixel electrode, and the like are provided. As shown in FIG. 1, a is gate layer 10 comprises a gate 12 and a gate line 11 connected to the gate. A source/drain layer 20 comprises a source 22, a drain 23 of a thin film transistor, and a data line 21 connected to the source 22. A pixel electrode 30 is connected to the drain 23 via a via hole (a region within the dotted box 1) in the protective layer. The active layer is located in the region within the dotted box 2.

An overlapping region is present between the gate layer 10 and the source/drain layer 20, which comprises an overlapping region between the source 22 and the gate 12. The source 22 is provided with a hollow structure at a position where it overlaps the gate 12, and the hollow structure comprises a plurality of openings 24. As shown in the figure, the opening 24 exposes the gate 12.

It is to be noted that, although the concept of the present disclosure is illustrated by way of the example in FIG. 1 in which the hollow structure is arranged on the source 22, the hollow structure may be arranged on any one or more of the gate 12, the source 22 and the drain 23.

Figure 2:
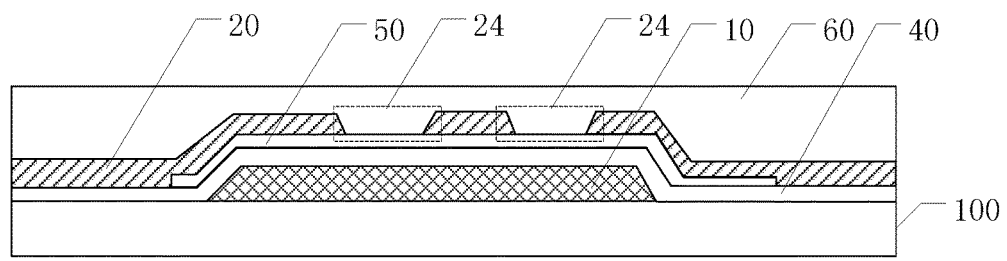
FIG. 2 is a schematic sectional view along the direction AA' of FIG. 1.

FIG. 2 is a schematic sectional view along the direction AA' of FIG. 1. As shown in FIG. 2, a gate layer 10, a gate insulating layer (GI layer) 40, an active layer 50, a source/drain layer 20, and a protective layer (PL layer) 60 are arranged on a base substrate 100 successively. By arranging the opening 24 at a position where the source/drain layer 20 overlaps the gate layer 10, the overlapping area between the source/drain layer 20 and the gate layer 10 can be effectively reduced, thereby reducing the coupling capacitance between the gate layer and the source/drain layer.

Figure 3:
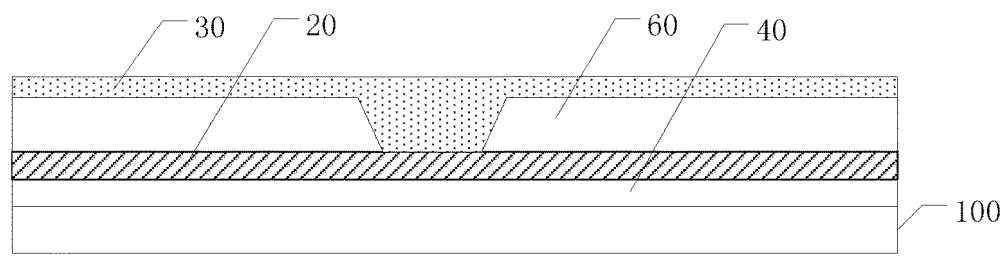
FIG. 3 is a schematic sectional view along the direction BB' of FIG. 1.

FIG. 3 is a schematic sectional view along the direction BB' of FIG. 1. As shown in FIG. 3, the pixel electrode 30 is connected to the drain 23 in the source/drain layer 20 via a via hole in the protective layer 60.

The material of the gate layer 10 may be molybdenum (Mo) or aluminum (Al), and the material of the active layer 50 may be amorphous silicon, polysilicon or oxide semiconductor material.

Figure 6:
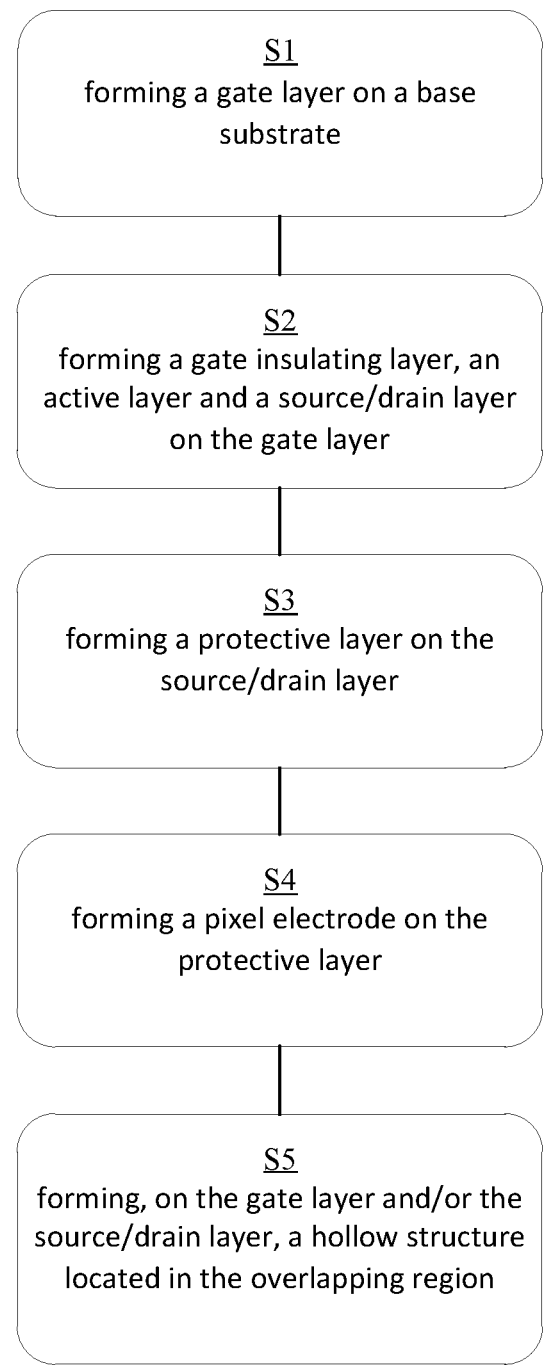
FIG. 6 is a flow chart of a method of manufacturing a pixel structure according to embodiments of the disclosure.

Specifically, for the above pixel structure, a manufacturing method thereof may comprise the steps shown in FIG. 6.

In step S1, a gate layer is formed on the base substrate. For example, one or more metal thin films are deposited on the base substrate (which may be a glass substrate). The material of the metal thin film may be Mo, Al or an alloy thereof. The gate layer is formed by subjecting the metal thin film to processes such as mask exposure, development, etching, and the like. In particular, the gate layer may comprise a gate line (gate metal trace) and a gate pattern of the thin film transistor.

In step S2, a gate insulating layer, an active layer and a source/drain layer are formed on the gate layer. For example, a gate insulating layer (GI) is deposited on the gate layer, and then a semiconductor thin film is formed using materials such as amorphous silicon, polysilicon, or oxide semiconductor. An active layer of the thin film transistor is formed by subjecting the semiconductor thin film to processes such as mask exposure, development, etching, and the like. Then, one or more metal thin films are deposited. The material of the metal thin films may be Mo, Al or an alloy thereof, and the like. The source/drain layer is formed by subjecting the metal thin films to processes such as exposure, development, etching, and the like. Specifically, the gate insulating layer (GI layer), the active layer, and the source/drain layer are arranged on the gate layer successively. The source/drain layer comprises a source, a drain of the thin film transistor, and a data line.

In step S3, a protective layer is formed on the source/drain layer. For example, a protective layer is formed on the source/drain layer using a resin material or other inorganic materials. Of course, a via hole may also be formed therein by processes such as exposure, development, and the like, if necessary.

In step S4, a pixel electrode is formed on the protective layer. For example, a transparent conductive thin film such as an ITO material is deposited on the protective layer, and a transparent conductive pattern such as a pixel electrode or a common electrode, etc is formed by processes such as exposure, development, etching, and the like.

In step S5, a hollow structure located in the overlapping region is formed on the gate layer and/or the source/drain layer. The hollow structure may be formed by processes such as exposure, development, etching, and the like.

Figure 4:
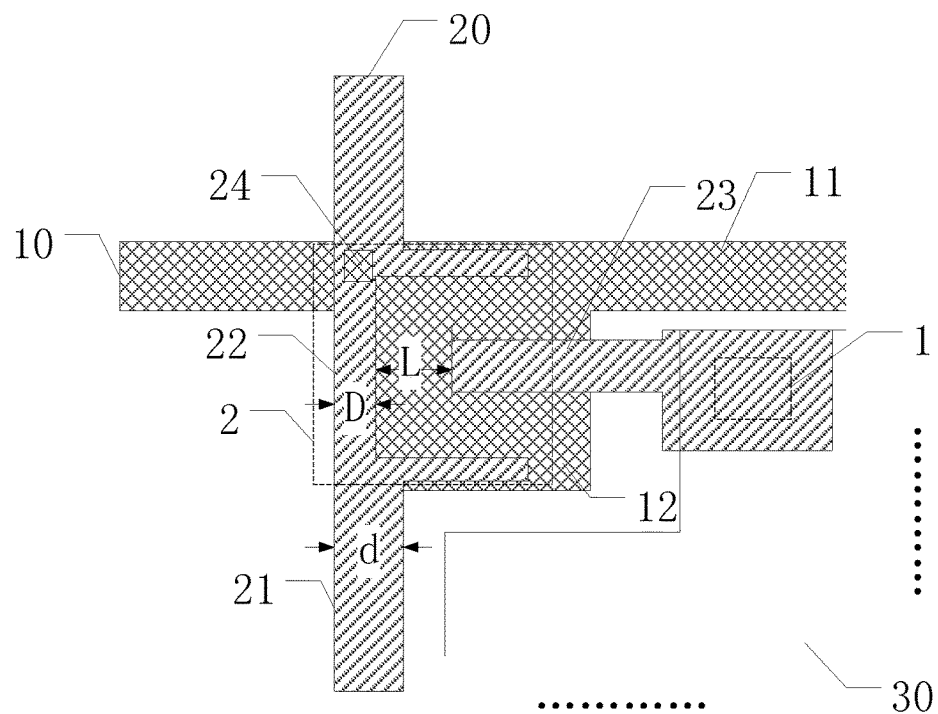
FIG. 4 is a schematic view of another pixel structure according to embodiments of the present disclosure.

To further reduce the overlapping area between the source/drain layer and the gate layer, the width of the source can be appropriately reduced. For example, as shown in FIG. 4, the width D of the source 22 may be smaller than the width d of the data lines 21 of the source/drain layer at other positions.

In some embodiments, the channel length L of the thin film transistor is from 2 μm to 8 μm, for example 5 μm. Such a channel length has the advantages that the area of the gate can be reduced, and furthermore, not only the overlapping region between the source/drain layer and the gate layer can be reduced, but also an increase in the leakage current of the thin film transistor due to the decrease in the source width can be avoided.

Figure 5:
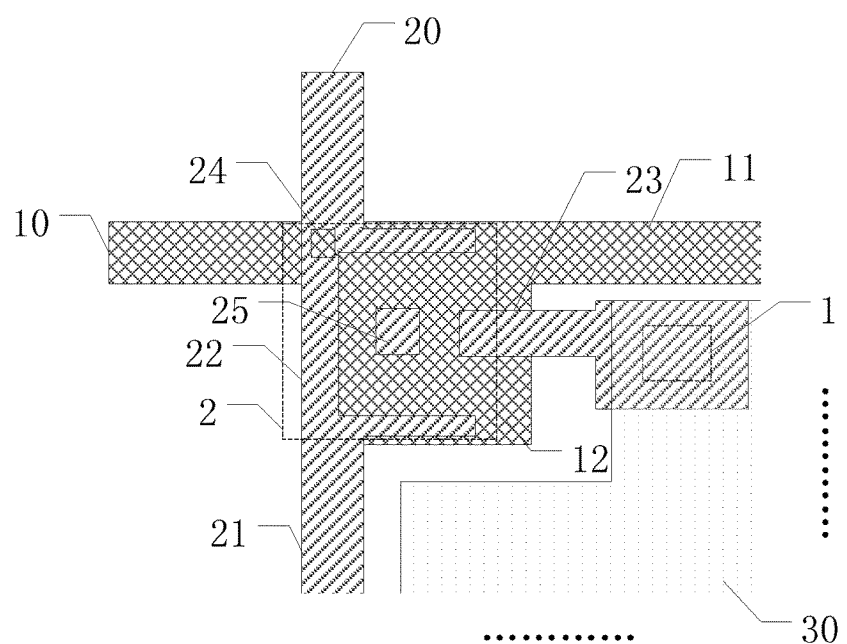
FIG. 5 is a schematic view of a further another pixel structure according to embodiments of the present disclosure.

Furthermore, in order to avoid an increase in the leakage current of the thin film transistor due to the decrease in the source width, an intermediate electrode may be further provided between the source and the drain of the thin film transistor, thereby forming two thin film transistors connected in series. As shown in FIG. 5, in the pixel structure, the source/drain layer 20 comprises not only the source 22, the drain 23 of the thin film transistor, and the data line 21 connected to the source 22, but also an intermediate electrode 25 provided between the source 22 and the drain 23 and separated from the source 22 and the drain 23. The presence of the intermediate electrode 25 enables the realization of two thin film transistors connected in series (i.e. the source 22 and the intermediate electrode 25 form a thin film transistor, and the intermediate electrode 25 and the drain 23 form another thin film transistor), thereby reducing the leakage current.

The above-described pixel structure may be a pixel structure in a TN mode display device, or a pixel structure in a VA, IPS, or ADS mode display device, which is not specifically limited in the present disclosure.

In the pixel structure provided by embodiments of the present is disclosure, the overlapping area between the source/drain layer and the gate layer can be effectively reduced by arranging a hollow structure at a position on the gate layer where it overlaps the source/drain layer and/or at a position on the source/drain layer where it overlaps the gate layer, thereby reducing the coupling capacitance between the gate layer and the source/drain layer. The inclusion of the hollow structure not only avoids generation of a large variation (Δ Vp) in the pixel voltage such that the gray scale displayed by the pixel in the end would not severely deviate from the gray scale desired to be expressed by the originally written voltage, but also prevents the voltage having symmetrical positive and negative polarities which is written by the data line from deviating downward to generate DC residue.

In addition, embodiments of the present disclosure further provide an array substrate comprising the above-described pixel structure.

Embodiments of the present disclosure further provide a display device comprising the above-described array substrate. The display device may be any product or component having display function such as a notebook computer display screen, a liquid crystal display, a liquid crystal TV, a digital photo frame, a mobile phone, a tablet computer, and the like.

The above example implementations are only provided to illustrate the present disclosure rather than to limit it. Those ordinarily skilled in the art can further make various variations and modifications without departing from the spirit and scope of the present application. Thus, all equivalent technical solutions also fall within the scope of the present disclosure. The protection scope of the present application shall be defined by the claims.

The invention claimed is:

1. A pixel structure comprising: a base substrate, and a gate layer and a source/drain layer arranged on the base substrate, wherein
an overlapping region is present between the gate layer and the source/drain layer, at least one of the gate layer and the source/drain layer comprises a hollow structure located in the overlapping region,
the hollow structure is configured to reduce a coupling capacitance between the gate layer and the source/drain layer,
the gate layer comprises a gate of a thin film transistor, and the source drain layer comprise a source and a drain of the thin film transistor, and
the source/drain layer further comprises a data line connected to the source and an intermediate electrode provided between the source and the drain and separated from the source and the drain, wherein a width of the source is less than a width of the data line.

2. The pixel structure according to claim 1, wherein the hollow structure comprises one or more openings.

3. The pixel structure according to claim 2, wherein a shape of the opening in the hollow structure is any one of a triangular shape, a rectangular shape, and a circular shape.

4. The pixel structure according to claim 1, wherein the overlapping region comprises an overlapping region between the source and the gate.

5. The pixel structure according to claim 1, wherein the overlapping region comprises an overlapping region between the drain and the gate.

6. The pixel structure according to claim 1, wherein a channel length of the thin film transistor is 2 μm to 8 μm.

7. The pixel structure according to claim 6, wherein a channel length of the thin film transistor is 5 μm.

8. The pixel structure according to claim 1, wherein the base substrate farther comprises a gate insulating layer, an active layer, a protective layer, and a pixel electrode.

9. The pixel structure according to claim 8, wherein the active layer is made of amorphous silicon, polysilicon, or oxide semiconductor material.

10. An array substrate comprising: the pixel structure according to claim 1.

11. A display device comprising: the array substrate according to claim 10.

12. A method of manufacturing a pixel structure comprising:
forming a gate layer on a base substrate;
forming a gate insulating layer, an active layer and a source/drain layer on the gate layer;
forming a protective layer on the source/drain layer;
forming a pixel electrode on the protective layer;
wherein an overlapping region is present between the gate layer and the source/drain layer,
the method further comprises forming, on at least one of the gate layer and the source/source layer, a hollow structure located in the overlapping region, the hollow structure configured to reduce a coupling capacitance between the gate layer and the source/drain layer,
the gate layer comprises a gate of a thin film transistor, and the source/drain layer comprises a source and a drain of the thin film transistor, and
the source/drain layer further comprises a data line connected the source and an intermediate electrode provided between the source and the drain and separated from the source and the drain, wherein a width of the source is less than a width of the data line.

13. The array substrate according to claim 10, wherein the hollow structure comprises one or more openings.

14. The array substrate according to claim 13, wherein a shape of the opening in the hollow structure is any one of a triangular shape, a rectangular shape, and a circular shape.

15. The array substrate according to claim 10, wherein the overlapping region comprises an overlapping region between the source and the gate.

16. The array substrate according to claim 10, wherein the overlapping region comprises an overlapping region between the drain and the gate.

* * * * *